(12) United States Patent
Oborina et al.

(10) Patent No.: US 8,803,533 B2
(45) Date of Patent: Aug. 12, 2014

(54) NONCONTACT DETERMINATION OF INTERFACE TRAP DENSITY FOR SEMICONDUCTOR-DIELECTRIC INTERFACE STRUCTURES

(75) Inventors: Elena I. Oborina, Tampa, FL (US); Andrew Hoff, Tampa, FL (US)

(73) Assignee: University of South Florida, Tampa, FL (US)

( * ) Notice: Subject to any disclaimer, the term of this patent is extended or adjusted under 35 U.S.C. 154(b) by 295 days.

(21) Appl. No.: 13/345,050

(22) Filed: Jan. 6, 2012

(65) Prior Publication Data

US 2012/0176146 A1    Jul. 12, 2012

Related U.S. Application Data

(60) Provisional application No. 61/430,446, filed on Jan. 6, 2011.

(51) Int. Cl.
| | |
|---|---|
| *G01R 31/26* | (2014.01) |
| *G01R 31/28* | (2006.01) |
| *H01L 21/66* | (2006.01) |

(52) U.S. Cl.
CPC ........ *G01R 31/2648* (2013.01); *G01R 31/2831* (2013.01); *H01L 22/14* (2013.01)
USPC ..................... 324/658; 324/76.39; 324/103 R

(58) Field of Classification Search
CPC . G01R 31/2648; G01R 31/2831; H01L 22/14
USPC ........ 324/76.39, 103 R, 519, 658; 438/14–17
See application file for complete search history.

(56) References Cited

U.S. PATENT DOCUMENTS

| | | | |
|---|---|---|---|
| 5,661,408 A | 8/1997 | Kamieniecki et al. | |
| 5,773,989 A | 6/1998 | Edelman et al. | |
| 6,028,012 A | 2/2000 | Wang | |
| 6,037,797 A | 3/2000 | Lagowski et al. | |
| 6,165,822 A | 12/2000 | Okuno et al. | |
| 7,103,484 B1 | 9/2006 | Shi et al. | |
| 7,719,294 B1 * | 5/2010 | Samsavar et al. | ........ 324/754.21 |

(Continued)

OTHER PUBLICATIONS

Dieter Schroder, Surface voltage and surface photovoltage: history, theory and applications, Dec. 14, 2000, Meas. Sci. Technol., 12 (2001) R16-R31.*

(Continued)

*Primary Examiner* — Huy Q Phan
*Assistant Examiner* — Adam Clarke
(74) *Attorney, Agent, or Firm* — Saliwanchik, Lloyd & Eisenschenk

(57) ABSTRACT

Embodiments of the subject method and apparatus relate to a sequence of noncontact Corona-Kelvin Metrology that allows the determination and monitoring of interface properties in dielectric/wide band gap semiconductor structures. The technique involves the incremental application of precise and measured quantities of corona charge, $Q_C$, onto the dielectric surface followed by determination of the contact potential difference, $V_{CPD}$, as the material structure response. The V-Q characteristics obtained are used to extract the surface barrier, $V_{SB}$, response related to the applied corona charge. An intersection of the $V_{CPD}$-$Q_C$ characteristic obtained in the dark with the $V_{OX}$-$Q_C$ characteristic representing the dielectric response is determined. The specific $V_{SB}$-$Q_C$ dependence surrounding the reference $V_{FB}$ value is obtained and the dielectric interface trap density and its spectrum is determined. A method and apparatus to quantify and separate trapped charge components is provided.

19 Claims, 3 Drawing Sheets

(56) References Cited

U.S. PATENT DOCUMENTS

| | | | |
|---|---|---|---|
| 2003/0117155 A1* | 6/2003 | Horner et al. | 324/719 |
| 2005/0201150 A1* | 9/2005 | Wang | 365/185.3 |
| 2006/0152229 A1* | 7/2006 | Ju | 324/637 |
| 2007/0148792 A1 | 6/2007 | Marx et al. | |
| 2007/0188185 A1* | 8/2007 | Eom et al. | 324/765 |
| 2008/0297189 A1* | 12/2008 | Everaert et al. | 324/765 |

OTHER PUBLICATIONS

E.I. Oborina and A. M. Hoff, Noncontact interface trap determination of SiO2-4H-SiC structures, Jan. 6, 2010, Jour. Appl. Phys., 107, 013703-1.*

Arnold, E., "Charge-Sheet Model for Silicon Carbide Inversion Layers," *IEEE Transactions on Electron Devices*, Mar. 1999, vol. 46, No. 3, pp. 497-503.

Belyaev, A., et al., "Application of Non-Contact Corona-Kelvin Metrology for Characterization of Plasma Nitrided $SiO_2$," 2007 International Conference on Frontiers of Characterization and Metrology for Nanoelectronics, Mar. 27-29, 2007, Gaithersburg, MD; AIP Conference Proceedings, vol. 931, pp. 270-274.

Besocke, K., et al., "Piezoelectric Driven Kelvin Probe for Contact Potential Difference Studies," *Review of Scientific Instruments*, Jul. 1976, vol. 47, No. 7, pp. 840-842.

Cochrane, C.J., et al., "Direct Observation of Lifetime Killing Defects in 4H SiC Epitaxial Layers Through Spin Dependent Recombination in Bipolar Junction Transistors," *Journal of Applied Physics*, Mar. 2009, vol. 105, No. 6, pp. 064502-064502-7.

Debusk, D.K., et al., "Fast Noncontact Diffusion Process Monitoring," *Solid State Technology*, Apr. 1999, vol. 42.4, pp. 1-5.

Goldman, M., et al., "The Corona Discharge, Its Properties and Specific Uses," *Pure and Applied Chemistry*, Jul. 1985, vol. 57, No. 9, pp. 1353-1362.

Hiyoshi, T., et al., "Reduction of Deep Levels and Improvement of Carrier Lifetime in n-Type 4H-SiC by Thermal Oxidation," *Applied Physics Express*, 2009, vol. 2, No. 4, pp. 041101-1-041101-3.

Hughes, G.W., et al., "Oxide Thickness Dependence of High-Energy-Electron-, VUV-, and Corona-Induced Charge in MOS Capacitors," *Applied Physics Letters*, Sep. 15, 1976, vol. 29, No. 6, pp. 377-379.

Kimoto, T., et al., "Lifetime-Killing Defects in 4H-SiC Epilayers and Lifetime Control by Low-Energy Electron Irradiation," *Physica Status Solidi B: Basic Solid State Physics*, Jul. 2008, vol. 245, No. 7, pp. 1327-1336.

Klein, P.B., "Carrier Lifetime Measurement in $n$-4H—SiC Epilayers," *Journal of Applied Physics*, Feb. 2008, vol. 103, No. 3, pp. 033702-1-0337021-4.

Kordina, O., et al., "The Minority Carrier Lifetime of $n$-Type 4H- and 6H—SiC Epitaxial Layers," *Applied Physics Letters*, Jul. 29, 1996, vol. 69, No. 5, pp. 679-681.

Lelis, A.J., et al., "Time Dependence of Bias-Stress-Induced SiC MOSFET Threshold-Voltage Instability Measurements," *IEEE Transactions on Electron Devices*, Aug. 2008, vol. 55, No. 8, pp. 1835-1840.

Oborina, E.I., et al., "Fowler-Nordheim Analysis of Oxides on 4*H*-SiC Substrates Using Noncontact Metrology," *Journal of Applied Physics*, Oct. 2009, vol. 106, pp. 083703-1-083703-6.

Pavlik, M., et al., "Generation of $[H_3O]^+.(H_2O)_n$ Clusters by Positive Corona Discharge in Air," *Rapid Communications in Mass Spectrometry*, Oct. 1997, vol. 11, No. 16, pp. 1757-1766.

Surplice, N.A, et al., "A Critique of the Kelvin Method of Measuring Work Functions," *Journal of Physics E: Scientific Instruments*, Jul. 1970, vol. 3, No. 7, pp. 477-482.

Trichel, G.W., "The Mechanism of the Negative Point to Plane Corona Near Onset," *Physical Review*, Dec. 15, 1938, vol. 54, No. 12, pp. 1078-1084.

Weinberg, Z.A., et al., "High-Field Transpot in $SiO_2$ on Silicon Induced by Corona Charging of the Unmetallized Surface," *Journal of Applied Physics*, Jan. 1976, vol. 47, No. 1, pp. 248-255.

Weinberg, Z.A., "On Tunneling in Metal-Oxide-Silicon Structures," *Journal of Applied Physics*, Jul. 1982, vol. 53, No. 7, pp. 5052-5056.

Weinberg, Z.A., "Tunneling of Electrons From Si Into Thermally Grown $SiO_2$," *Solid-State Electronics*, Jan. 1977, vol. 20, No. 1, pp. 11-18.

Williams, R., et al., "Electron Multiplication and Surface Charge on Zinc Oxide Single Crystals," *Journal of Applied Physics*, Jul. 1968, vol. 39, No. 8, pp. 3731-3736.

Williams, R., et al., "High Electric Fields in Silicon Dioxide Produced by Corona Charging," *Journal of Applied Physics*, Mar. 1973, vol. 44, No. 3, pp. 1026-1028.

Williams, R., et al., "Image Forces and the Behavior of Mobile Positive Ions in Silicon Dioxide," *Applied Physics Letters*, May 1, 1973, vol. 22, No. 9, pp. 458-459.

Williams, R., et al., "Mobile Fluoride Ions in $SiO_2$," *Journal of Applied Physics*, Feb. 1975, vol. 46, No. 2, pp. 695-698.

Wilson, M., et al., "COCOS (Corona Oxide Characterization of Semiconductor) Non-Contact Metrology for Gate Dielectrics," Characterization and Metrology for ULSI Technology, Jun. 26-29, 2000, Gaithersburg, MD; AIP Conference Proceedings, vol. 550, pp. 220-225.

Woods, M.H., et al., "Hole Traps in Silicon Dioxide," *Journal of Applied Physics*, Mar. 1976, vol. 47, No. 3, pp. 1082-1089.

Woods, M.H., et al., "Injection and Removal of Ionic Charge at Room Temperature Through the Interface of Air with $SiO_2$," *Journal of Applied Physics*, Dec. 1973, vol. 44, No. 12, pp. 5506-5510.

Edelman, P., et al., "Non-Contact C-V Measurements of Ultra Thin Dielectrics," *The European Physical Journal: Applied Physics*, Jul. 2004, vol. 27, Nos. 1-3, pp. 495-498.

Hoff, A.M., et al., "Degradation of Oxide Properties Caused by Low-Level Metallic.Contamination," *Journal of the Electrochemical Society*, 2007, vol. 154, No. 11, pp. H977-H982.

Hoff, A.M., et al., "Fast Non-Contact Dielectric Characterization for SiC MOS Processing," *Silicon Carbide and Related Materials 2006, Pts 1 and 2*, ed. R.P. Devaty et.al., 2006, pp. 1035-1038.

Hoff, A.M., et al., "Thermal Oxidation of 4H-Silicon Carbide Using the Afterglow Method," *Silicon Carbide and Related Materials 2003, Pts 1 and 2*, vol. 457-460, 2004, pp. 1349-1352.

Savtchouk, A., et al., "Non-contact Doping Profiling in Epitaxial SiC," *Silicon Carbide and Related Materials 2003, Pts 1 and 2*, vol. 457-460, 2004, pp. 755-758.

Williams, R., et al., "Behavior of Ions in $SiO_2$," *Journal of Vacuum Science and Technology*, Nov. 1974, vol. 11, No. 6, pp. 1025-1027.

Williams, R., et al., "Properties of the Silicon-SiO2 Interface", Sep. 1977, vol. 14, No. 5, pp. 1106-1101.

Wilson, M., et al., "COCOS (Corona Oxide Characterization of Semiconductor) Metrology: Physical Principles and Applications," ASTM, 1999, San Jose, CA.

Wilson, M., et al., "COCOS (Corona Oxide Characterization of Semiconductor) Non-Contact Metrology for Gate Dielectrics," *Characterization and Metrology for ULSI Technology*, vol. 550, ed. D.G. Seiler et al., 2001, AIP, pp. 220-225.

Wilson, M., et al., "The Present Status and Recent Advancements in Corona-Kelvin Non-Contact Electrical Metrology of Dielectrics for IC-Manufacturing Electrical Characterization," *ECS Transactions*, 2007, vol. 11, pp. 347-361.

* cited by examiner

NONCONTACT DETERMINATION OF INTERFACE TRAP DENSITY FOR SEMICONDUCTOR-DIELECTRIC INTERFACE STRUCTURES

This invention was made with government support under Grant Number W911NF-05-2-0038 awarded by the Army/Army Research Office. The government has certain rights in the invention.

BACKGROUND OF INVENTION

Corona ions may be generated from air by the application of high voltage to fine wires and sharp electrode tips (G. W. Trichel, Physical Review 54, 1078 (1938); R. Williams and A. Willis, J. Appl. Phys. 39, 3731-3736 (1968); M. Goldman, A. Goldman, and R. S. Sigmond, Pure & Appl. Chem. 57, 1353-1362 (1985); M. Pavlik and J. D. Skalny, Rapid Communications in Mass Spectrometry 11, 1757-1766 (1997)). The deposition of corona ions has been used for decades to apply electric fields to dielectrics and to other electronic material structures. Such methods avoid the fabrication of electrodes on the material surface. When combined with a Kelvin probe (K. Besocke and S. Berger, Rev. Sci. Instrum. 47, 840-842 (1976)), this noncontact approach permits the potential of the charged, or biased, surface to be determined. The combination has been used to study electronic trapping in materials, mobile ion density, and transport through dielectric films (R. Williams and A. Willis, J. Appl. Phys. 39, 3731-3736 (1968); G. W. Hughes, R. J. Powell, and M. H. Woods, Appl. Phys. Lett. 29, 377-379 (1976); R. Williams, Journal of Vacuum Science & Technology 11, 1025-1027 (1974); R. Williams, Journal of Vacuum Science & Technology 14, 1106-1101 (1977); R. Williams and M. H. Woods, J. Appl. Phys. 44, 1026-1028 (1973); R. Williams and M. H. Woods, Appl. Phys. Lett. 22, 458-459 (1973), R. Williams and M. H. Woods, J. Appl. Phys. 46, 695-698 (1975); M. H. Woods and R. Williams, J. Appl. Phys. 44, 5506-5510 (1973); M. H. Woods and R. Williams, J. Appl. Phys. 47, 1082-1089 (1976); P. Edelman, A. M. Hoff, L. Jastrzebski, and J. Lagowski, U.S. Pat. No. 5,773,989, 1998; A. M. Hoff, S. Aravamudhan, A. Isti, and E. I. Oborina, J. Electrochem, Soc. 154, H977-H982 (2007)). For example, tunneling due to substrate emission in oxide films on silicon can be accomplished by biasing the structures with deposited corona ions and measuring the resulting potential decay with a Kelvin probe (Z. A. Weinberg, W. C. Johnson, and M. A. Lampert, J. Appl. Phys. 47, 248-255 (1976); Z. A. Weinberg, Solid-State Electron. 20, 11-18 (1977); Z. A. Weinberg, J. Appl. Phys. 53, 5052-5056 (1982)). The need for in-line monitoring and control of manufacturing processes led to the application of these methods in the silicon integrated circuits industry (P. Edelman, A. M. Hoff, L. Jastrzebski, and J. Lagowski, U.S. Pat. No. 5,773, 989, 1998; M. Wilson, J. Lagowski, A. Savtchouk, L. Jastrzebski, and J. D'Amico, in COCOS (Corona Oxide Characterization of Semiconductor) Metrology: Physical Principles and Applications, San Jose, Calif., 1999 (ASTM); D. K. DeBusk and A. M. Hoff, Solid State Technology 42, 67 (1999)).

Corona-Kelvin metrology, C-KM, is now in common use in integrated circuit manufacturing for noncontact and preparation-free characterization of dielectrics on silicon (M. Wilson, D. Marinskiy, A. Byelyayev, J. D'Amico, A. Findlay, P. Edelman, L. Jastrzebski, and J. Lagowski, Trans. ECS 11, 347-361 (2007)). The metrology involves three elements: (1) placement of a precise amount of electric charge on a dielectric surface as ions from a corona discharge in air; (2) monitoring the surface voltage change with a vibrating Kelvin probe; and (3) determination of the semiconductor surface barrier potential, $V_{SB}$, separate from the dielectric potential, $V_{OX}$. In the case of oxides on SiC, this metrology has been applied to the determination of the capacitance-voltage dependence (A. M. Hoff and E. Oborina, in Silicon Carbide and Related Materials 2006, Pts 1 and 2, edited by R. P. Devaty, D. J. Larkin, and S. E. Saddow (2006), p. 1035-1038; A. M. Hoff, E. Oborina, S. E. Saddow, and A. Savtchouk, in Silicon Carbide and Related Materials 2003, Pts 1 and 2; Vol. 457-460 (2004), p. 1349-1352) and Fowler-Nordheim characteristics (E. I. Oborina, H. Benjamin, and A. M. Hoff, J. Appl. Phys. in press (2009)) of as-grown dielectrics. However, there exists a problem applying Corona-Kelvin metrology to oxides on SiC. In particular, with the application of oxides on SiC, there exists a problem with the third part of the Corona-Kelvin metrology process. The third element is used to obtain dielectric charges, Qit, and the dielectric interface trap density, Dit. The specific zero value of the surface photovoltage identifies the flat-band condition at dielectric-silicon interface, where the flat-band condition is a reference in calculation of the silicon surface barrier, Vsb, and the barrier change upon corona charging. Corona charge at flat-band gives the total dielectric charge, Qtot. With silicon, the surface photovoltage can be found fairly easily with the use of a light with photon energy larger than the silicon energy gap of 1.1 eV, and a photon energy small enough to not cause any oxide charge changes. The problem with SiC is that the energy gap is 3 eV. This value is above the band gap illumination where significant changes would occur to the interface charge, Qit, and the dielectric trapped charge, Dit.

Starting from a defined initial condition of a dielectric-semiconductor structure, the automated sequential accomplishment of elements 1 and 2 of the Corona-Kelvin metrology determine the voltage-charge characteristics, V-Q, the capacitance-charge characteristics, C-Q, and the electrical thickness of the dielectric film on the semiconductor (M. Wilson, D. Marinskiy, A. Byelyayev, J. D'Amico, A. Findlay, P. Edelman, L. Jastrzebski, and J. Lagowski, Trans. ECS 11, 347-361 (2007)). To quantify the dielectric charges and the interface trap density in as-grown dielectric-silicon structures the third element can be implemented. The $V_{SB}$ value for each quantity of deposited charge on the surface during the measurement sequence is obtained from the difference between the total structure voltage determined in the dark and the structure voltage when the material is illuminated to null the band bending at the semiconductor surface. Following each illumination, a relatively short time is required in the silicon to establish the pre-illumination value of the total voltage once the light is turned off. Therefore, in a typical sequence of measurements on silicon, where the semiconductor is swept from accumulation to depletion, two V-Q curves are generated that correspond to: A) the dielectric voltage versus density of charge applied, light measurements; and B) the total voltage of the structure versus the charge applied, dark measurements. The difference between curves A and B corresponds to the $V_{SB}$-Q characteristic. Further, characteristics A and B intersect at the flatband potential. In the case of the wide band gap material SiC, a recovery time for $V_{CPD}$ comparable to silicon following illumination is not experimentally observed.

Again, the specific zero value of $V_{SB}$ identifies the flatband condition at the dielectric-semiconductor interface. This flatband condition is a reference in calculations of the semiconductor space charge and the change in $V_{SB}$ induced by charging the dielectric surface with corona ions. For example, the quantity of corona charge needed to achieve flatband starting from the initial charge state of the oxide, gives the total dielectric charge, $Q_{TOT}$ (M. Wilson, J. Lagowski, L. Jastrzebski, A. Savtchouk, and V. Faifer, in *Characterization and Metrology for ULSI Technology; Vol.* 550, edited by D. G. Seiler, A. C. Diebold, R. McDonald, W. M. Bullis, P. J. Smith, and E. M. Secula (AIP, 2001), p. 220-225), present in an as-grown film. In the case of silicon, $V_{SB}$ is easily driven to zero volts, independent of the charge density on the dielectric surface, using light with photon energy larger than the silicon energy gap of 1.1 eV, but at the same time a sufficiently low intensity is used to avoid photo-induced change of the oxide charge.

Accordingly, there is a need in the art for a method and apparatus for determining the interface trap charge and/or interface trap density of a semiconductor-dielectric or semiconductor-oxide interface, for wideband gap semiconductor and/or structures having charge centers (e.g., defects) that do not depopulate after illuminating and turning illumination off.

BRIEF SUMMARY

Embodiments of the subject invention relate to a method and apparatus for determining the interface trap charge and/or interface trap density at a semiconductor-dielectric interface or a semiconductor-oxide interface. Specific embodiments can determine the interface trap density in a non-contact manner. A specific embodiment can determine the interface trap density of $SiO_2$-4H—SiC structures. Specific embodiments of the subject method and apparatus can be used to characterize interfaces of any semiconductor-dielectric interfaces where rapid recovery to pre-illumination potential value after illumination with light, allowing quick modulation of the contact potential difference voltage of the structure, is not possible. For cases where rapid recovery after illumination of the structure is not possible, determination of the surface barrier potential as a function of charge applied to the surface needed to obtain the interface trap dependence on the surface charge is difficult and/or not viable. Semiconductor materials to which embodiments of the subject method and apparatus can be applied include, but are not limited to, SiC, GaN, GaAs, and wide bandgap semiconductors used in field effect structures. Embodiments of the invention can be utilized with semiconductors, for example n-type or p-type, having a range of doping densities, such as, but not limited to, $10^{11}/cm^3$ to $10^{18}/cm^3$. Specific embodiments can be utilized with n-type or p-type semiconductors having doping densities in the range $10^{14}/cm^3$ to $10^{18}/cm^3$.

In accordance with embodiments of the invention, relating to SiC, an approach to obtain the surface barrier voltage, $V_{SB}$, and its dependence on the density of applied charge can be utilized that determines the reference flatband voltage, $V_{FB}$, from the V-Q characteristic acquired in the dark, using independent determination of the semiconductor doping density and the oxide capacitance. Once $V_{FB}$ is determined, the corona-Kelvin procedure may be used to calculate the surface barrier voltage and the interface trap density spectrum, $D_{it}$ versus surface charge, $Q_C$. In addition, the oxide trap charge may be quantitatively characterized as demonstrated from the $V_{FB}$ shift following high field injection of charges from SiC into the oxide. Noncontact trap charge and interface trap densities can be accomplished using this approach for the case of oxide films grown on SiC.

Embodiments can use the first two elements of the Corona-Kelvin metrology, namely (1) placement of a precise amount of electric charge on a dielectric surface as ions from a corona discharge in air and (2) monitoring the surface voltage change with a vibrating Kelvin probe, for SiC to measure surface photovoltage for SiC. The flat-band condition can be determined from the V-Q and C-Q characteristics determined via elements (1) and (2). Further SiC doping, $N_d$, can be determined from the V-Q characteristic in deep depletion and the oxide capacitance, $C_{ox}$, can be determined from C-Q saturation in deep accumulation. Once Cox and Nd are known, the flat-band capacitance can be identified on C-Q characteristics. This can then lead to a corresponding corona charge that gives the total oxide charge, $Q_{tot}$. The corresponding voltage gives the flat-band voltage, $V_{FB}$. Once this is completed, the standard Corona-Kelvin procedure can be used to calculate the surface barrier, $V_{sb}$, and the $D_{it}$. The $Q_{it}$ can then be found by using the $V_{FB}$ shift after high field corona pushing that causes injection of charges from SiC into the oxide.

DETAILED DISCLOSURE

Figure 1:
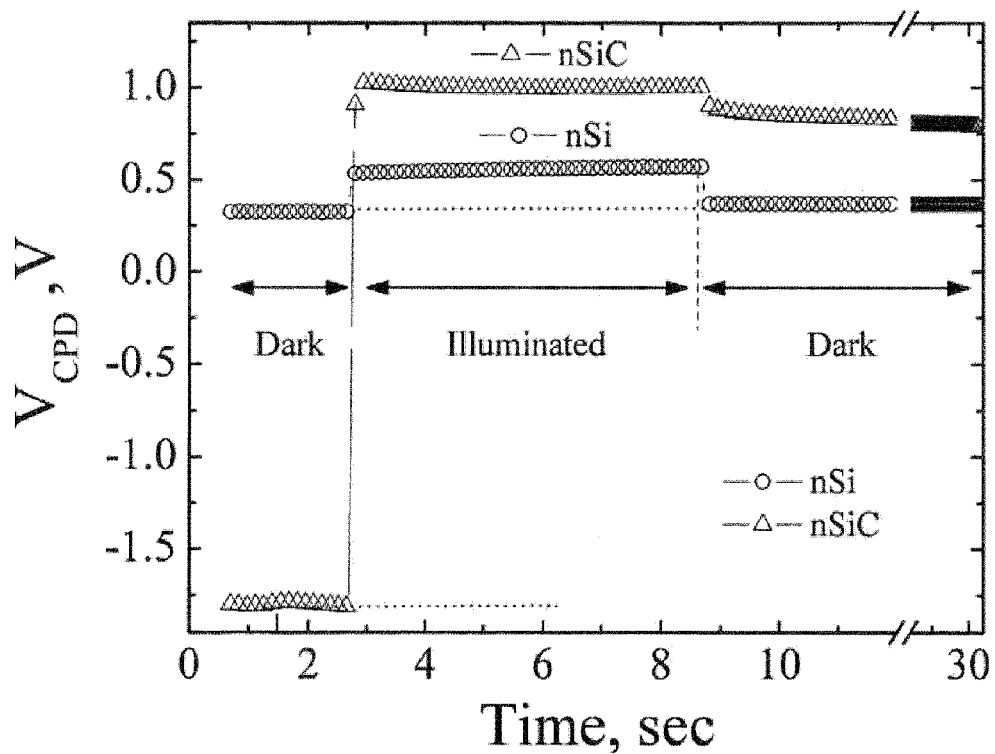
FIG. 1 shows light modulation of the $V_{CPD}$ of silicon and SiC oxide-semiconductor structures demonstrating poor recovery to initial state $V_{CPD}$ following illumination in the case of SiC.

Embodiments of the subject invention relate to a method and apparatus for determining the interface trap charge and/or interface trap density at an interface of a semiconductor and dielectric, or oxide. Examples of structures with respect to which embodiments of the subject method and apparatus can be applied include, but are not limited to, a dielectric film disposed on a semiconductor and an oxide layer disposed on a semiconductor. Specific embodiments can determine the interface trap in a non-contact manner. A specific embodiment can determine the interface trap of $SiO_2$-4H—SiC structures.

In accordance with embodiments of the invention, relating to SiC, an approach to obtain the surface barrier and its dependence on the density of applied charge can be utilized that determines the reference flatband voltage from the V-Q characteristic acquired in the dark, using independent determination of the semiconductor doping density and the oxide capacitance, Once $V_{FB}$ is determined, the corona-Kelvin procedure may be used to calculate the surface barrier and the interface trap density spectrum. In addition, the oxide trap charge may be quantitatively characterized as demonstrated from the $V_{FB}$ shift following high field injection of charges from SiC into the oxide. Noncontact trap charge and interface trap densities can be accomplished using this approach for the case of oxide films grown on SiC.

Embodiments can use the first two elements of the Corona-Kelvin metrology, namely (1) placement of a precise amount of electric charge on a dielectric surface as ions from a corona discharge in air and (2) monitoring the surface voltage change with a vibrating Kelvin probe. The flat-band condition can be determined from the V-Q and C-Q characteristics determined via elements (1) and (2). Further SiC doping, $N_d$, can be determined from the V-Q characteristic in deep depletion and the oxide capacitance, $C_{ox}$, can be deter mined from C-Q saturation in deep accumulation. Once $C_{ox}$ and $N_d$ are known, the flat-band capacitance can be identified on C-Q characteristics. The corresponding voltage gives the flat-band voltage, $V_{FB}$. Once this is completed, the standard Corona-Kelvin procedure can be used to calculate the surface barrier, $V_{sb}$, and the interface trap density, $D_{it}$.

Procedure for Noncontact $D_{it}$ on Si

Noncontact corona oxide characterization metrology was initially developed to characterize the oxide integrity of $SiO_2$—Si structures (M. Wilson, J. Lagowski, A. Savtchouk, L. Jastrzebski, and J. D'Amico, in COCOS (Corona Oxide Characterization of Semiconductor) Metrology: Physical Principles and Applications, San Jose, Calif., 1999 (ASTM); J. Lagowski, P. Edelman, and M. D. Wilson, U.S. Pat. No. 6,037,797, 2000; J. Lagowski and P. Edelman, in Inst. Phys. Conf. Ser.; Vol. 160, edited by J. Donecker and I. Rechenberg (lop Publishing Ltd, 1997), p. 133-144) and later was successfully applied to advanced dielectrics on Si substrates (M. Wilson, D. Marinskiy, A. Byelyayev, J. D'Amico, A. Findlay, P. Edelman, L. Jastrzebski, and J. Lagowski, Trans. ECS 11, 347-361 (2007); P. Edelman, A. Savtchouk, M. Wilson, J. D'Amico, J. N. Kochey, D. Marinskiy, and J. Lagowski, Eur. Phys. J.-Appl. Phys 27, 495-498 (2004)). As an in-line metrology, the incorporated instrumentation makes measurements in order to calibrate and quantify both the deposited charge density and the voltage determined with the Kelvin method (Semiconductor Diagnostics, Inc. Tampa, Fla., FAaST Tools, http://www.sditampa.com, (2008); N. A. Surplice and R. J. Darcy, J. Phys. E-Sci. Inst. 3, 477-482 (1970)). User-specified quanta of corona charge from air are deposited on the dielectric surface to provide bias and the response of the structure is determined from measurement of the contact potential difference voltage, $V_{CPD}$. For an oxide-silicon structure, the $V_{CPD}$ value includes three components:

$$V_{CPD}=\Phi_{ms}^0+V_{SB}+V_{OX},\quad(1)$$

where $\Phi_{ms}^0$ is the metal-semiconductor contact potential difference without any surface charge. Since, typical calculations determine a change in $V_{CPD}$ with an increment of charging, the first component drops from consideration and does not contain information regarding the dielectric. The two remaining components are important to characterize parameters of the dielectric and only one of them, $V_{SB}$, may be modulated by illumination with sufficient photon energy, $h\nu \geq E_g$, to effectively eliminate band bending at the semiconductor surface. However, the intensity of this illumination is preferably kept sufficiently low such that the oxide is not damaged or charged by the illumination process. A green light diode with $h\nu=2.36$ eV is typically adequate for $SiO_2$—Si structures. Hence the difference in $V_{CPD}$ measured in the dark and under illumination can be used to determine the value of $V_{SB}$ from Equation (1) as, $$V_{SB}=V_{CPD}^{Dark}-V_{CPD}^{Light}.\quad(2)$$

Placing a controlled quantum of corona charge, $\Delta Q_C$, on the oxide surface is equivalent to the application of an electric field value $\Delta E_{OX}=\Delta Q_C/\epsilon_{OX}\epsilon_0$ on the dielectric and provides a change in the voltage drop across oxide equal to $\Delta V_{OX}=\Delta Q_C/C_{OX}$. Charge conservation requires that the charge deposited on the dielectric surface be balanced by charges in the semiconductor. This image charge is opposite in polarity and includes the semiconductor space charge $\Delta Q_{SC}$ and charge trapped at the interface, $\Delta Q_{it}$:

$$\Delta Q_C=-(\Delta Q_{SC}+\Delta Q_{it}).\quad(3)$$

According to semiconductor theory, knowledge of the doping density and surface barrier provides for determination of the space charge density, in coulomb-cm$^{-2}$, from (S. M. Sze, Physics of Semiconductor Devices (John Wiley & Sons, 1969); E. H. Nicollian and J. R. Brews, MOS (Metal Oxide Semiconductor) Physics and Technology (John Wiley & Sons, 1982); E. Arnold, IEEE Trans. Electron Devices 46, 497-503 (1999)):

$$Q_{SC}=\pm q(N_{A,D})\times L_D\times F(V_{SB}),\quad(4)$$

where $N_{A,D}$ is the doping concentration, q is the electron charge, $L_D$ is the extrinsic Debye length, and F is a unitless function of the measured surface barrier value. From Equations (3) and (4) the charge trapped at the interface may be determined from, $$|\Delta Q_{it}|=|\Delta Q_C|-|\Delta Q_{SC}|.\quad(5)$$

The derivative of Equation (5) with respect to $V_{SB}$, divided by the elemental charge, determines the interface trap density and spectrum of $D_{it}$ over a range of surface barrier values (J. Lagowski, P. Edelman, and M. D. Wilson, U.S. Pat. No. 6,037,797, 2000), $$D_{it}=\Delta Q_{it}/(q\times\Delta V_{SB}).\quad(6)$$

In silicon, the standard measurement routine includes the sequential determination of $V_{CPD}^{Dark}$ and $V_{CPD}^{Light}$ to obtain the $V_{SB}$ value using Equation (2) for each increment of applied corona charge, $\Delta Q_C$. As noted, the charge is specified in the measurement routine and monitored independently by the instrument system for each deposition. From the accumulated charge dependence and Equations (2)-(6) the spectrum of $D_{it}$ within the depletion regime of the silicon semiconductor is determined. In addition, the important reference value $V_{FB}$, or flatband voltage when the surface barrier is equal to zero is also obtained from the sequence of charging and dark/light voltage values.

Metrology Approach for $D_{it}$ on SiC

The combination of corona charge deposition and the Kelvin method with the semiconductor physics described above, such as the determination of the space charge correspondence to $V_{SB}$ (S. M. Sze, Physics of Semiconductor Devices (John Wiley & Sons, 1969); E. H. Nicollian and J. R. Brews, MOS (Metal Oxide Semiconductor) Physics and Technology (John Wiley & Sons, 1982); E. Arnold, IEEE Trans. Electron Devices 46, 497-503 (1999)), can be applied to any dielectric-semiconductor system. However, practice of the method described by Lagowski (J. Lagowski, P. Edelman, and M. D. Wilson, U.S. Pat. No. 6,037,797, 2000), which directly determines $V_{SB}$ and $V_{OX}$ for each increment of deposited corona charge, cannot be utilized in the case of semiconductor-dielectric interfaces that do not rapidly recover after illumination with light, such as interfaces between dielectrics and SiC. The significant technological issue with certain semiconductors, such as SiC, with a high concentration of electrical defects present in the semiconductor material (O. Kordina, J. P. Bergman, C. Hallin, and E. Janzen, Appl. Phys. Lett. 69, 679-681 (1996); T. Kimoto, K. Danno, and J. Suda, Phys. Status Solidi B-Basic Solid State Phys. 245, 1327-1336 (2008); T. Hiyoshi and T. Kimoto, Appl. Phys. Express 2, 0411011-0411013 (2009); P. B. Klein, J. Appl. Phys. 103, 0337021-03370214 (2008); C. J. Cochrane, P. M. Lenahan, and A. J. Lelis, J. Appl, Phys. 105, 0645021-0645027 (2009)) is that the high concentration of electrical defects imposes trapping and emission time constants in a manner that prohibits quick modulation of $V_{CPD}$ with light, from an initial value to a value under illumination and then a quick return to the initial value when the light is extinguished. This issue is demonstrated by FIG. 1, where for n-type Si and SiC, $V_{CPD}$ is modulated with light from an initial value in the dark to a value under illumination. When the light is turned off, the Si value of $V_{CPD}$ recovers to the pre-illumination value in a fraction of a second. This behavior is not observed with SiC where 20 seconds after the illumination has ceased the $V_{CPD}$ value has recovered to less than 10% of the change in voltage obtained at the onset of illumination. Indicators of high density of defects in SiC materials are provided by the extremely low minority carrier lifetime (O. Kordina, J. P. Bergman, C. Hallin, and E. Janzen, Appl. Phys. Lett. 69, 679-681 (1996)), deep trap states identified by transient spectroscopy (T. Kimoto, K. Danno, and J. Suda, Phys. Status Solidi B-Basic Solid State Phys. 245, 1327-1336 (2008)), and spin dependent recombination spectroscopy (C. J. Cochrane, P. M. Lenahan, and A. J. Lelis, J. Appl. Phys. 105, 0645021-0645027 (2009)). The light pulse used to flatten the energy bands at the SiC surface also likely fills many of these trap states. When the light is removed the emission rates are apparently low indicating a long time would be required to re-establish the net space charge that would yield the pre-illumination value of $V_{CPD}$.

For the case of SiC substrates, and other materials, such as developing materials, that may have similar defects, embodiments of the subject method and apparatus can be utilized. With respect to a specific embodiment, only one $V_{CPD}$-$Q_C$ characteristic is obtained in the dark. A sequence can be performed as a sweep from a $V_{CPD}$ value where the semiconductor is in strong accumulation to a $V_{CPD}$ value where the semiconductor is in depletion. To determine the important flatband reference value of $V_{CPD}$, the doping level in the semiconductor (A. Savtchouk, E. Oborina, A. M. Hoff, and J. Lagowski, in *Silicon Carbide and Related Materials 2003, Pts 1 and 2; Vol.* 457-460 (2004), p. 755-758) and the oxide capacitance value determined from the V-Q characteristic in accumulation can be used.

Figure 2:
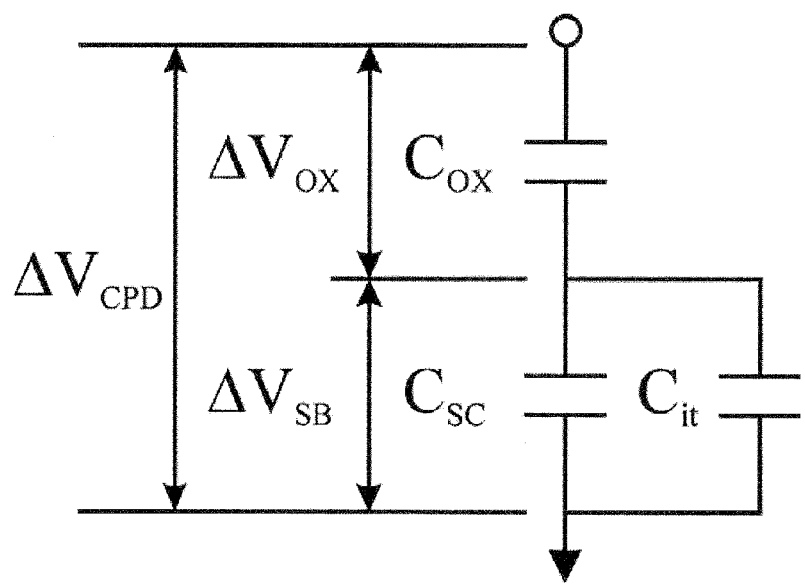
FIG. 2 shows an equivalent circuit of oxide semiconductor system including capacitance associated with interface traps.

The equivalent circuit presented in FIG. 2 shows the corresponding voltage change, $\Delta V_{CPD}$, obtained by placing a quantum of corona charge, $\Delta Q_C$, on the oxide surface. The ratio of the two measured quantities $\Delta V_{CPD}/\Delta Q_C$ is the inverse capacitance, $C^{-1}$ and may be represented by the equation:

$$C^{-1} = C_{OX}^{-1} + (C_{SC} + C_{it})^{-1}. \quad (7)$$

In an embodiment, an instrument system can determine $V_{CPD}$ with a precision of less than 0.1 mV. Each charge increment can be monitored during a measurement sequence relative to a target value specified by the user. In various embodiments, each charge increment can be unique, one or more charge increments can be the same with one or more charge increments being different, or all of the charge increments can be the same For example, a target charge increment of $1 \times 10^{11}$ q/cm$^2$ may be used and the consistency of this value measured by the instrument during each ion deposition interval. Multiplication of Equation (7) by $Q_C$ yields the total $V_{CPD}$ of the structure where the first term on the right provides $V_{OX}$ and the second $V_{SB}$. In line with FIG. 2 and Equation (7) the capacitance under strong accumulation, when $V_{SB} \to 0V$ becomes practically equal to $C_{OX}$.

A straight line may be defined in V-Q space with slope equal to $C_{OX}^{-1}$ and determined experimentally from measurement of the derivative of $V_{CPD}$ versus $Q_C$ in accumulation. Accumulation can be confirmed in a specific embodiment, by observing that the ratio $\Delta V_{CPD}/\Delta Q_C$ remains substantially constant after placement of two or more additional incremental charge is deposited having an opposite sign as the initial charge deposited. This ratio will be substantially the same if $\Delta V_{CPD}$ is the same for two deposits of charge where the amount of charge deposited is the same. In specific embodiments, the ratios can be considered the same or substantially the same if ratios are within 10%, 5%, 4%, 3%, and/or 2% of each other. The intersection of this line and the $V_{CPD}$-$Q_C$ characteristic acquired in the dark occurs when $V_{SB}=0V$ as predicted from FIG. 2 and Equation (7). At this intersection, the needed reference for changes in oxide voltage and total voltage of the structure as a function of applied charge can be established.

The total capacitance dependence of the structure on deposited charge can be obtained from differentiation of the $V_{CPD}$-$Q_C$ characteristic acquired. According to [40] the flatband capacitance $C_{FB}$ is obtained from:

$$C_{FB} = \frac{C_{OX} C_S}{C_{OX} + C_S} \quad (8)$$

where $C_{OX}$ was just experimentally determined. The semiconductor capacitance, $C_S$, at flatband condition is determined from, $$C_S = \frac{\varepsilon_S \varepsilon_0}{L_D} \quad (9)$$

where $\varepsilon_S$ and $\varepsilon_0$ are the relative and vacuum permittivity values and $L_D$ is the extrinsic Debye length of the semiconductor given by, $$L_D = [kT \varepsilon_S \varepsilon_0 / q^2 N_{D/A}]^{1/2}, \quad (10),$$

where $N_{D/A}$ is the semiconductor doping density and (kT/q) the thermal voltage. The doping density value for the calculation in Equation 10 can be provided, assumed, measured, or determined independently by an appropriate method such as a noncontact method demonstrated for SiC (A. Savtchouk, E. Oborina, A. M. Hoff, and J. Lagowski, in *Silicon Carbide and Related Materials 2003, Pts 1 and 2; Vol.* 457-460 (2004), p. 755-758). Also, for the case of a wafer that is non-uniformly doped with depth, such as a substrate doped to a density $N_{sub}$ coated by an epitaxial layer of doping $N_{epi}$, determination of the flatband voltage can be performed with respect to the built-in barrier and depends on the ratio ($N_{sub}/N_{epi}$) as discussed in (D. K. Schroder, *Semiconductor Material and Device Characterization*, 2 ed. (John Wiley & Sons, New York, 1998)). An extra (V-Q)$_{acc}$ measurement under illumination may be performed to increase the accuracy of $C_{OX}$ extraction especially if there is good reason to believe that extra space charge may exist in the structure under investigation. This situation may occur at the interface between the substrate and an epitaxial film. For the case of n-type epitaxial SiC on a heavily doped n-type SiC substrate no difference was observed for $C_{OX}$ measured either in the dark or under illumination.

Once $C_{FB}$ has been determined with Equation (8), the corresponding $Q_C$ value may be identified on the C-$Q_C$ curve and from this $V_{CPD}=V_{FB}$ is determined from the $V_{CPD}$-$Q_C$ characteristic. This reference point establishes a correspondence between applied charge and the changes induced in the oxide potential and total $V_{CPD}$ values by $Q_C$ deposition. Equation (2) may then be applied to determine the $V_{SB}$ response to each increment of deposited corona charge relative to this reference value. The $V_{SB}$-$Q_C$ dependence thus obtained is sufficient to proceed to calculations of $D_{it}$ and its spectrum as described by Equations (2)-(6). Hence, an embodiment of the subject method can completely avoid the use of light modulation of $V_{CPD}$ to determine $V_{SB}$.

Example Application of Noncontact $D_{it}$ to Thermal Oxide—SiC Structures

A commercial metrology instrument system, FAaST-200 (Semiconductor Diagnostics, Inc. Tampa, Fla., FAaST Tools, http://www.sditampa.com, (2008)), designed for monitoring silicon IC MOS manufacture, was modified to realize an embodiment of the subject method and an embodiment of the subject apparatus. For enhanced accuracy of $C_{OX}$ determination, a UV light emitting diode, with hv=3.33 eV, was used to perform measurements of the dielectric capacitance with the semiconductor in accumulation. Possible charging and other deleterious effects that might result from use of this illuminator were carefully evaluated using precision charging and voltage determination in conjunction with the LED illumination. Oxidized Si and SiC wafers were coated with blanket corona charge to achieve a deep accumulation condition in the semiconductor followed by high density contact potential difference $V_{CPD}$ mapping (P, Edelman, A. M. Hoff, L. Jastrzebski, and J. Lagowski, U.S. Pat. No. 5,773,989, 1998; A. M. Hoff and D. K. DeBusk, in *PV199916: Analytical and Diagnostic Techniques for Semiconductor Materials, Devices, and Processes*, edited by B. Kolbesen, C. Claeys, P. Stallhofer, F. Tardif, J. Benton, T. Shaffner, D. Schroeder, S. Kishino, and P. Rai-Choudhury (Electrochemical Society, 1999)). The structure was illuminated with the LED UV light at 9 specific measurement locations on each wafer for 30 seconds. Following this light exposure, another $V_{CPD}$ high density, 6000 point, map was acquired on each sample. From FIG. 2, any charge trapping caused by the illumination in the dielectric or at the interface would be observed from a difference in $V_{CPD}$ acquired before and after illumination compared to regions that were not illuminated. In all samples and locations, no differences were observed in the map distributions or in their average voltage values before and after illumination. In other words, the 9 illuminated locations were indistinguishable from the remaining oxide area on the wafer surfaces in the high density $V_{CPD}$ maps. This result suggests that this particular UV source configuration does not induce charge leakage through or trapping in oxide films on Si or SiC.

As an example of the new measurement procedure to determine a $D_{it}$ spectrum, an 8° off axis, n-type, 4H—SiC 76.2 mm diameter wafer was thermally oxidized at temperature above 1100° C. and annealed in an NO ambient also at a temperature not below 1100° C. The average doping of this epitaxial film was $N_D=5\times10^{15}$ cm$^{-3}$. Voltage-charge, $V_{CPD}$-$Q_C$, characteristics were acquired by placing an initial dose of positive charge on the oxide surface adequate to accumulate majority charge in the semiconductor at each measurement site across the wafer. This was followed by the addition of increments of negative corona charge to sweep the surface barrier toward depletion.

Figure 3:
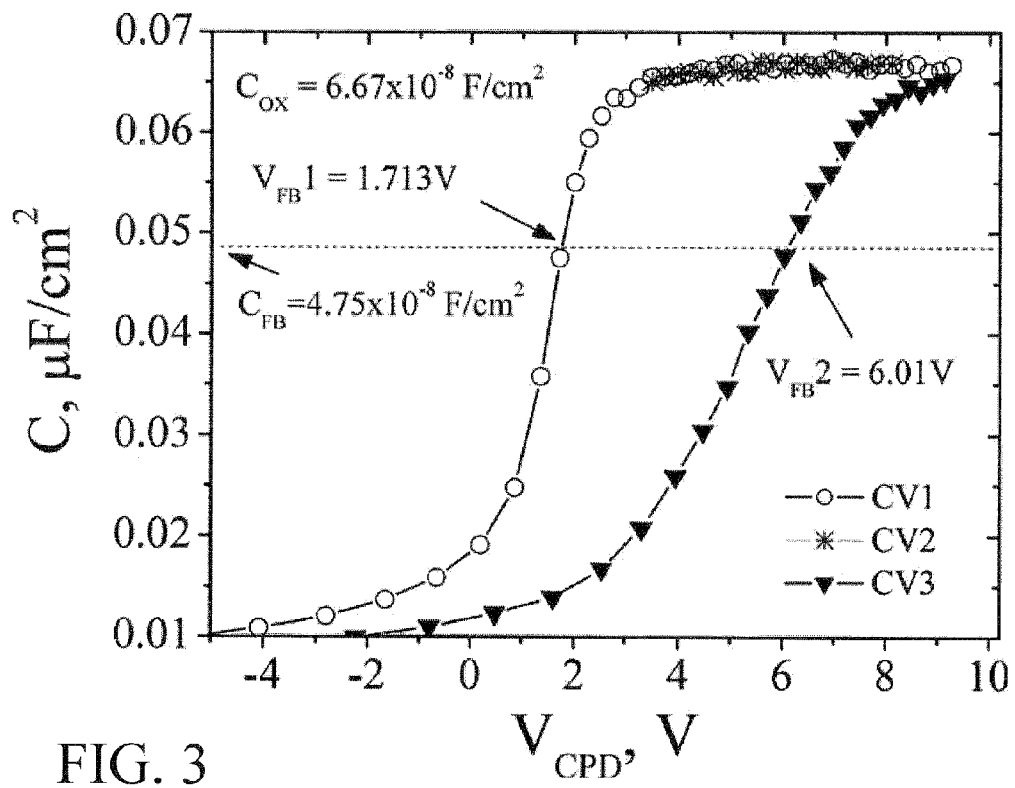
FIG. 3 shows non-contact C-V characteristics, where CV1 data corresponds to moderate stress (dark), CV2 data corresponds to moderate stress (illuminated), and CV3 data corresponds to high field stressing to induce interface trapping and flatband shift.

Example results of C-V plots, derived from the $V_{CPD}$-$Q_C$ characteristics obtained, are presented in FIG. 3. Note that all curves were obtained at the same location on the wafer and are representative of results from multiple locations on the wafer. The first two curves, CV1 and CV2, in FIG. 3 were acquired after moderate stress in accumulation and relate to measurements performed in the dark, CV1, and under illumination, CV2. The oxide capacitance was found to be $C_{OX}=6.67\times10^{-8}$ F/cm$^2$ in agreement with both CV1 and CV2 characteristics. The agreement of these two characteristics also suggests that the determination of $C_{OX}$ using illumination is not required for typical substrates. One more curve, CV3, was measured after Fowler-Nordheim tunneling induced by a high positive potential dielectric stress for several minutes. The effect of such stress, and the resulting fluence of tunneling charge from the substrate to the surface, on the dielectric structure and interface properties is shown by characteristic CV3 in FIG. 3. The latter exhibits a significantly larger voltage transition range from accumulation to depletion, termed stretch-out, compared to the initial characteristic, CV1. The flatband capacitance was calculated according to Equation (8) as $C_{FB}=4.75\times10^{-8}$ F/cm$^2$.

Figure 5:
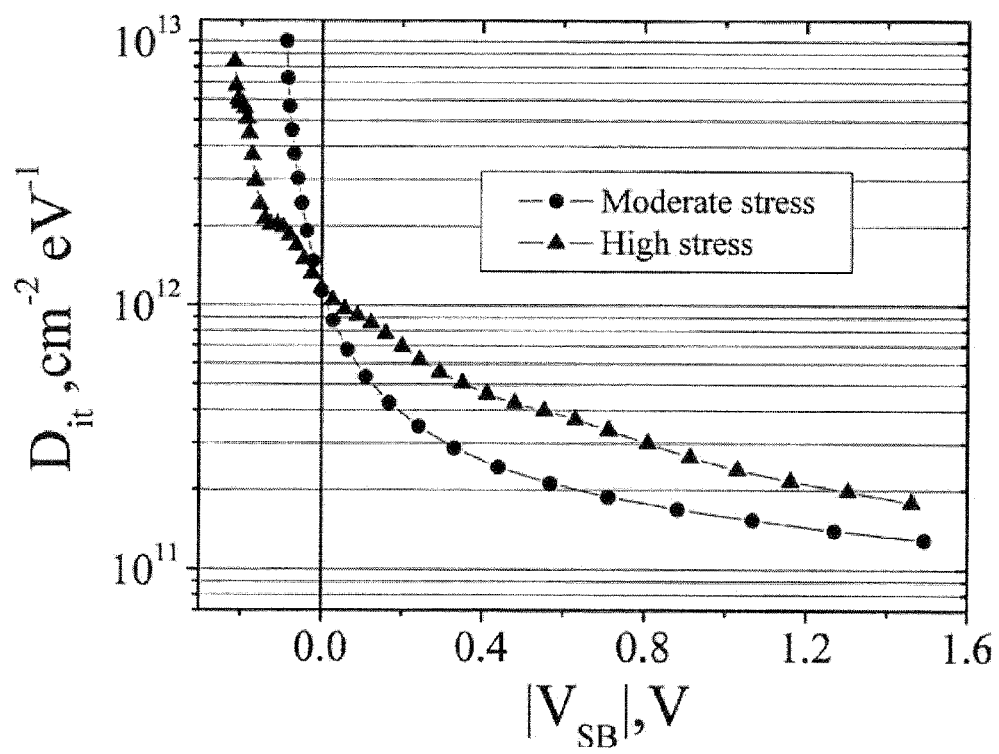
FIG. 5 shows interface trap density spectra comparing the spectra before (moderate stress) and following (high stress) high field Fowler-Nordheim stress of thermal oxide on n-type 4HSiC.
Figure 4:
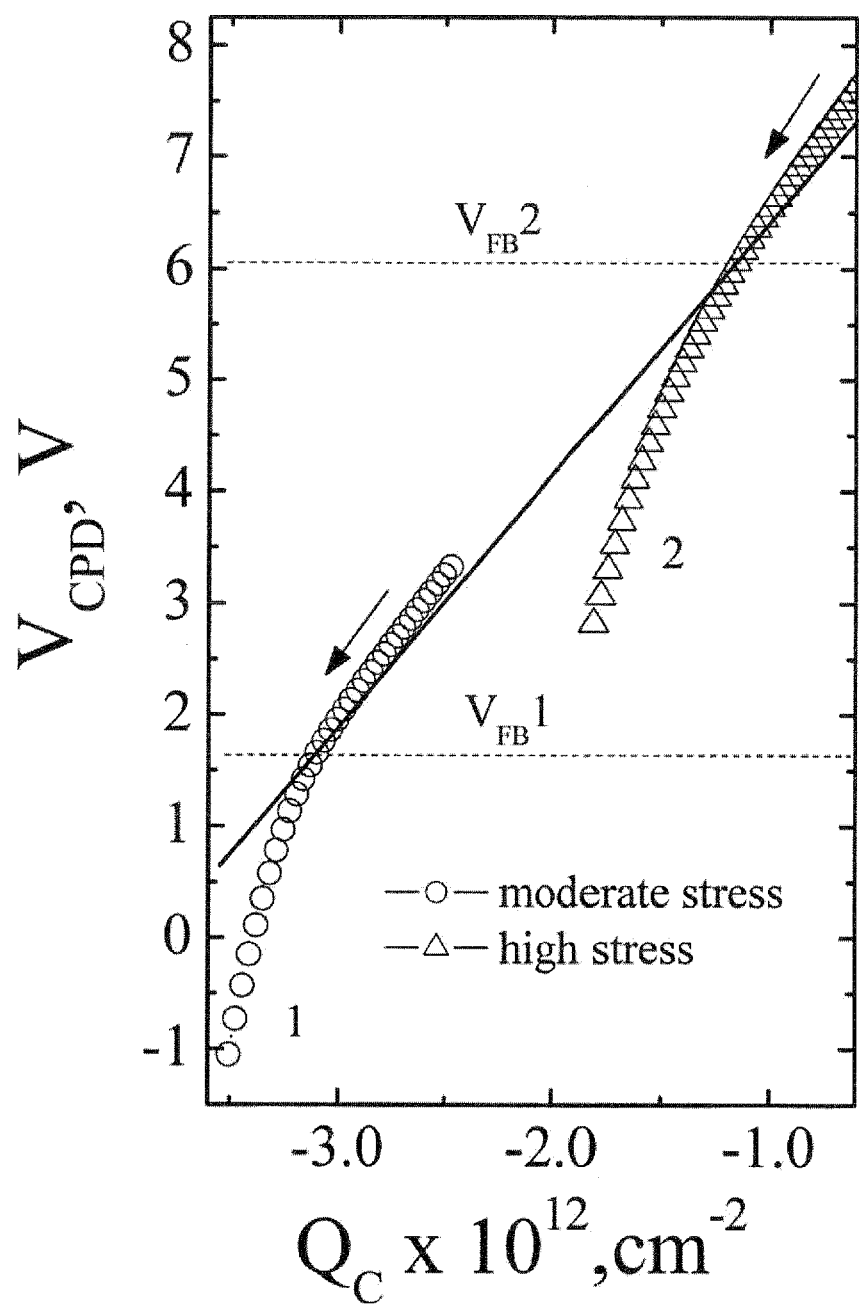
FIG. 4 shows V-Q characteristics measured after moderate stress and after high field stress, to increase the density of charge centers of the interface, where the solid line shows calculated V-Q characteristics from measured $C_{OX}$ and aligned with measured curves at $V_{FB}1$ and $V_{FB}2$, respectively.

The $V_{CPD}$-$Q_C$ characteristics used to produce the C-V curves in FIG. 3 are shown in FIG. 4, where the solid line, derived from $C_{OX}$ measurement, represents the $V_{OX}$-$Q_C$ characteristic as described above that intersects each of the respective $V_{CPD}$-$Q_C$ curves acquired in the dark at the respective flatband voltage points. These two characteristics, 1 and 2, relate to the oxide-SiC structure at a given wafer location following moderate and high stress in sequence. From this data, where $Q_C$ is the controlled parameter, the surface barrier voltage is determined from the difference between the $V_{CPD}$-$Q_C$ and $V_{OX}$-$Q_C$ curve for each condition and the corresponding $D_{it}$ spectra were calculated according to Equation (6) and are shown in FIG. 5. The effect of Fowler-Nordheim current stress, the high field stress condition, on the $D_{it}$ spectrum is to increase the trap density in depletion and shift the spectrum toward the conduction band edge above the reference $V_{SB}=0$ value.

As shown in FIG. 3 the heavy stress in accumulation leads to a flatband voltage shift, $\Delta V_{FB}=4.3$V. The added charge in the dielectric leading to the $\Delta V_{FB}$ observed represents a combination of injected charge both trapped in the oxide and in interface states. This effective combined trapped charge is estimated as: $\Delta Q_t^{ef}=\Delta V_{FB}\times C_{OX}=2.87\times10^{-7}$ C/cm$^2$. Note that the difference in trapped charge may be easily determined using FIG. 4 as the difference in $Q_C$ between the two $V_{FB}$, intersection points. The charge portion trapped at the interface, $\Delta Q_{it}$ may be calculated from Equation (5) and is a measure of the charge required to sweep the C-V characteristic from maximum to minimum capacitance values. In this manner, the difference in $Q_{it}$ between CV1 and CV3 of FIG. 3 was determined to be $\Delta Q_{it}=1.22\times10^{-7}$ C/cm$^2$. The effective charge trapped in the oxide by the stress process may be calculated as:

$$\Delta Q_t = (\Delta Q_t^{ef} - \Delta Q_{it}) = 1.65\cdot10^{-7} \text{ C/cm}^2 \quad (11).$$

Therefore, useful information may be derived from this approach that permits separation of charge density trapped either at the interface or in the oxide. This is of particular importance in the case of SiC where charge trapping near the interface is known to cause variations in threshold voltage control of transistors (A. J. Lelis, D. Habersat, R. Green, A. Ogunniyi, M. Gurfinkel, J. Suchle, and N. Goldsman, IEEE Trans. Electron Devices 55, 1835-1840 (2008)).

Accordingly, this example demonstrates a noncontact method to determine the surface barrier dependence on the control parameter, deposited corona charge or $Q_C$, for gateless oxide-semiconductor structures on n-type 4H—SiC. The approach does not depend on determination of the surface barrier values from modulation of the surface band bending in the semiconductor with light. Such $V_{SB}$ determination was shown to be not suitable for SiC, Embodiments of the subject method can be applied to other similar wide band gap semiconductors that have comparable populations of crystalline defects and deep traps. Embodiments of the method establish a correspondence between the respective responses of $V_{CPD}$ and $V_{OX}$ to deposited charge. The intersection of the two curves is obtained at the flatband voltage, extracted from calculation of the flatband capacitance and the associated $Q_C$ at $V_{FB}$. Examples of this approach were used to determine the $D_{it}$ spectral distribution versus $V_{SB}$ for thermal oxide grown on n-type 4H—SiC. Defects were induced in the band gap by high field stressing of the oxide in the Fowler-Nordheim regime using deposited corona charge. In addition, the combination of noncontact C-V and $D_{it}$ measurements provides an ability to separate the amount of charge trapped in the oxide and at the interface. The method may be applied to as-grown dielectric films and may be used as an in-line monitoring metrology for improvement of SiC oxide growth and annealing processes and in SiC MOS manufacturing.

SPECIFIC EMBODIMENTS

A specific embodiment 1 relates to a method of determining an interface trap density at an interface between a semiconductor and a dielectric or oxide layer disposed on a surface of the semiconductor, comprising:

placing an initial electric charge on at least a portion of a surface of a dielectric layer disposed on a semiconductor, wherein placing the initial electric charge on the surface of the dielectric layer creates an accumulation state in the semiconductor, wherein placing the initial charge on the surface of the dielectric layer results in an electric charge, $Q_C$, on the surface of the dielectric layer, placing at least two increments of additional electric charge on the portion of the surface of the dielectric layer, wherein each of the at least two increments of additional electric charge have the opposite sign as the initial electric charge, wherein after placement of the at least two increments of additional electric charge on the at least a portion of the surface of the dielectric layer the semiconductor is in depletion, wherein the electric charge, $Q_C$, changes with the placement of each of the at least two increments of additional electric charge, measuring a corresponding value of a contact potential difference voltage, $V_{CPD}$, after placement of each of the at least two increments of additional electric charge on the at least a portion of the surface of the dielectric layer, wherein each measured value of the contact potential difference, $V_{CPD}$, corresponds to a value of electric charge, $Q_C$, on the surface of the dielectric layer, determining a dielectric capacitance, $C_{OX}$, value of the dielectric layer while the semiconductor is in accumulation from the measured contact potential difference voltage, $V_{CPD}$, values and corresponding electric charge, $Q_C$, values, and values of the at least two increments of additional electric charge, determining a flat band voltage value of the contact potential difference voltage ($V_{CPD}$) from a doping level in the semiconductor and the dielectric capacitance value, $C_{OX}$, deriving a straight line, wherein a slope of the straight line is an inverse of the dielectric capacitance value, $C_{OX}$, such that the straight line intersects a $V_{CPD}$-$Q_C$ curve based on the measured contact potential difference voltage values, $V_{CPD}$, and corresponding electric charge values, $Q_C$, at the flatband voltage, $V_{FB}$, determining one or more surface barrier voltage values, $V_{SB}$, wherein the surface barrier voltage value, $V_{SB}$, is a difference between the contact potential difference voltage, $V_{CPD}$, on the $V_{CPD}$-$Q_C$ curve at the corresponding electric charge, $Q_C$, and a voltage value, $V_{OX}$, on the straight line at the corresponding electric charge, $Q_C$, and determining one or more interface trap densities, $D_{it}$, for a corresponding one or more electric charge values, $Q_C$, from the corresponding one or more electric charge values, $Q_C$, the corresponding surface barrier voltage values, $V_{SB}$, the doping level in the semiconductor, and an extrinsic Debye length, $L_D$, for the semiconductor.

Preferably the method of embodiment 1 is carried out such that the structure is not exposed to light in such a way as to fill the interface trap or other centers during the method.

The method of embodiment 1 can utilize an n-type semiconductor, such that the initial electric charge is a positive electric charge and the at least two increments of additional electric charge are negative electric charge.

Alternatively, the method of embodiment 1 can utilize a p-type semiconductor, such that the initial electric charge is a negative electric charge and the at least two increments of additional electric charge are positive electric charge.

In a further specific implementation of embodiment 1, determining the dielectric capacitance value, $C_{OX}$, can involve finding a slope of $V_{CPD}$ versus $Q_C$ while the semiconductor is in accumulation. In a specific embodiment, the slope of $V_{CPD}$ versus $Q_C$ while the semiconductor is in accumulation is the inverse of the dielectric capacitance value $C_{OX}$.

A further specific implementation of embodiment 1 can involve measuring a value of the $V_{CPD}$ before placement of the at least two increments of additional electric charge.

In a further specific implementation of embodiment 1, determining the flat band voltage, $V_{FB}$, comprises determining a flat band capacitance, $C_{FB}$, from the relationship $$C_{FB} = \frac{C_{OX} C_S}{C_{OX} + C_S},$$

where $C_S$ is a semiconductor capacitance, where $C_S$ is a function of the doping level in the semiconductor and the contact potential difference voltage, $V_{CPD}$, and determining the flat band voltage, $V_{FB}$, that corresponds to the flat band capacitance, $C_{FB}$, from the measured contact potential difference voltage values, $V_{CPD}$, and corresponding electric charge values, $Q_C$.

In a further specific implementation of embodiment 1, determining one or more interface trap densities, $D_{it}$, involves determining at least one interface trap density, $D_{it}$, corresponding to an electric charge, $Q_C$, having a corresponding contact potential difference voltage value, $V_{CPD}$, greater than the flat band voltage, $V_{FB}$. In an alternative implementation of embodiment 1, determining one or more interface trap densities, $D_{it}$, involves determining at least one interface trap density, $D_{it}$, corresponding to an electric charge, $Q_C$, having a corresponding contact potential difference voltage value, $V_{CPD}$, less than the flat band voltage, $V_{FB}$.

Specific embodiment 2 relates to a method of determining an interface trap charge at an interface between a semiconductor and a dielectric layer disposed on a surface of the semiconductor, comprising:

placing an initial electric charge on at least a portion of a surface of a dielectric layer disposed on a semiconductor, wherein placing the initial electric charge on the surface of the dielectric layer creates an accumulation state in the semiconductor, wherein placing the initial charge on the surface of the dielectric layer results in an electric charge, $Q_C$, on the surface of the dielectric layer, placing at least two increments of additional electric charge on the portion of the surface of the dielectric layer, wherein each of the at least two increments of additional electric charge have the opposite sign as the initial electric charge, wherein after placement of the at least two increments of additional electric charge on the at least a portion of the surface of the dielectric layer the semiconductor is in depletion, wherein the electric charge, $Q_C$, changes with the placement of each of the at least two increments of additional electric charge, measuring a corresponding value of a contact potential difference voltage, $V_{CPD}$, after placement of each of the at least two increments of additional electric charge on the at least a portion of the surface of the dielectric layer, wherein each measured value of the contact potential difference, $V_{CPD}$, corresponds to a value of electric charge, $Q_C$, on the surface of the dielectric layer, determining a dielectric capacitance, $C_{OX}$, value of the dielectric layer while the semiconductor is in accumulation from the measured contact potential difference voltage, $V_{CPD}$, values and corresponding electric charge, QC, values, and values of the at least two increments of additional electric charge, determining a flat band voltage value of the contact potential difference voltage ($V_{CPD}$) from a doping level in the semiconductor and the dielectric capacitance value, $C_{OX}$, deriving a straight line, wherein a slope of the straight line is an inverse of the dielectric capacitance value, $C_{OX}$, such that the straight line intersects a $V_{CPD}$-$Q_C$ curve based on the measured contact potential difference voltage values, $V_{CPD}$, and corresponding electric charge values, $Q_C$, at the flatband voltage, $V_{FB}$, determining one or more surface barrier voltage values, $V_{SB}$, wherein the surface barrier voltage value, $V_{SB}$, is a difference between the contact potential difference voltage, $V_{CPD}$, on the $V_{CPD}$-$Q_C$ curve at the corresponding electric charge, $Q_C$, and a voltage value, $V_{OX}$, on the straight line at the corresponding electric charge, $Q_C$, and determining one or more interface trap charge values, $Q_{it}$, for a corresponding one or more electric charge values, $Q_C$, from the corresponding one or more electric charge values, $Q_C$, the corresponding surface barrier voltage values, $V_{SB}$, the doping level in the semiconductor, and an extrinsic Debye length, $L_D$, for the semiconductor.

Aspects of the invention, such as control of the charge depositing and voltage measuring apparatus, may be described in the general context of computer-executable instructions, such as program modules, being executed by a computer. Generally, program modules include routines, programs, objects, components, data structures, etc., that perform particular tasks or implement particular abstract data types. Moreover, those skilled in the art will appreciate that the invention may be practiced with a variety of computer-system configurations, including multiprocessor systems, microprocessor-based or programmable-consumer electronics, minicomputers, mainframe computers, and the like. Any number of computer-systems and computer networks are acceptable for use with the present invention.

Specific hardware devices, programming languages, components, processes, protocols, and numerous details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention may be practiced without these specific details. Computer systems, servers, work stations, and other machines may be connected to one another across a communication medium including, for example, a network or networks.

As one skilled in the art will appreciate, embodiments of the present invention may be embodied as, among other things: a method, system, or computer-program product. Accordingly, the embodiments may take the form of a hardware embodiment, a software embodiment, or an embodiment combining software and hardware. In an embodiment, the present invention takes the form of a computer-program product that includes computer-useable instructions embodied on one or more computer-readable media.

Computer-readable media include both volatile and nonvolatile media, removable and nonremovable media, and contemplate media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to, information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently. The invention may be practiced in distributed-computing environments where tasks are performed by remote-processing devices that are linked through a communications network. In a distributed-computing environment, program modules may be located in both local and remote computer-storage media including memory storage devices. The computer-useable instructions form an interface to allow a computer to react according to a source of input. The instructions cooperate with other code segments to initiate a variety of tasks in response to data received in conjunction with the source of the received data. The present invention may be practiced in a network environment such as a communications network. Such networks are widely used to connect various types of network elements, such as routers, servers, gateways, and so forth. Further, the invention may be practiced in a multi-network environment having various, connected public and/or private networks. Communication between network elements may be wireless or wireline (wired). As will be appreciated by those skilled in the art, communication networks may take several different forms and may use several different communication protocols. The present invention is not limited by the forms and communication protocols described herein.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

[1] G. W. Trichel, Physical Review 54, 1078 (1938).
[2] R. Williams and A. Willis, J. Appl. Phys. 39, 3731-3736 (1968).

3 M. Goldman, A. Goldman, and R. S. Sigmond, Pure & Appl. Chem. 57, 1353-1362 (1985).

4 M. Pavlik and J. D. Skalny, Rapid Communications in Mass Spectrometry 11, 1757-1766 (1997).

5 K. Besocke and S. Berger, Rev. Sci. Instrum. 47, 840-842 (1976).

6 G. W. Hughes, R. J. Powell, and M. H. Woods, Appl. Phys. Lett. 29, 377-379 (1976).

7 R Williams, Journal of Vacuum Science & Technology 11, 1025-1027 (1974).

8 R. Williams, Journal of Vacuum Science & Technology 14, 1106-1101 (1977).

9 R. Williams and M. H. Woods, J. Appl. Phys. 44, 1026-1028 (1973).

10 R. Williams and M. H. Woods, Appl. Phys. Lett. 22, 458-459 (1973).

11 R. Williams and M. H. Woods, J. Appl. Phys. 46, 695-698 (1975).

12 M. H. Woods and R. Williams, J. Appl. Phys. 44, 5506-5510 (1973).

13 M. H. Woods and R. Williams, J. Appl. Phys. 47, 1082-1089 (1976).

14 P. Edelman, A. M. Hoff, L. Jastrzebski, and J. Lagowski, U.S. Pat. No. 5,773,989, 1998.

15 A. M. Hoff, S. Aravamudhan, A. Isti, and E. I. Oborina, J. Electrochem. Soc. 154, H977-H982 (2007).

16 Z. A. Weinberg, W. C. Johnson, and M. A. Lampert, J. Appl. Phys. 47, 248-255 (1976).

17 Z. A. Weinberg, Solid-State Electron. 20, 11-18 (1977).

18 Z. A. Weinberg, J. Appl. Phys. 53, 5052-5056 (1982).

19 M. Wilson, J. Lagowski, A. Savtchouk, L. Jastrzebski, and J. D'Amico, in COCOS (Corona Oxide Characterization of Semiconductor) Metrology: Physical Principles and Applications, San Jose, Calif., 1999 (ASTM).

20 D. K. DeBusk and A. M. Hoff, Solid State Technology 42, 67 (1999).

21 M. Wilson, D. Marinskiy, A. Byelyayev, J. D'Amico, A. Findlay, P. Edelman, L. Jastrzebski, and J. Lagowski, Trans. ECS 11, 347-361 (2007).

22 A. M. Hoff and E. Oborina, in Silicon Carbide and Related Materials 2006, Pts 1 and 2, edited by R. P. Devaty, D. J. Larkin, and S. E. Saddow (2006), p. 1035-1038.

23 A. M. Hoff, E. Oborina, S. E. Saddow, and A. Savtchouk, in Silicon Carbide and Related Materials 2003, Pts 1 and 2; Vol. 457-460 (2004), p. 1349-1352.

24 E. I. Oborina, H. Benjamin, and A. M. Hoff, J. Appl. Phys. in press (2009).

25 M. Wilson, J. Lagowski, L. Jastrzebski, A. Savtchouk, and V. Faifer, in Characterization and Metrology for ULSI Technology; Vol. 550, edited by D. G. Seiler, A. C. Diebold, R. McDonald, W. M. Bullis, P. J. Smith, and E. M. Secula (AIP, 2001), p. 220-225.

26 J. Lagowski, P. Edelman, and M. D. Wilson, U.S. Pat. No. 6,037,797, 2000.

27 J. Lagowski and P. Edelman, in Inst. Phys. Conf. Ser.; Vol. 160, edited by J. Donecker and I. Rechenberg (Iop Publishing Ltd, 1997), p. 133-144.

28 P. Edelman, A. Savtchouk, M. Wilson, J. D'Amico, J. N. Kochey, D. Marinskiy, and J. Lagowski, Eur. Phys. J.-Appl. Phys 27, 495-498 (2004).

29 Semiconductor Diagnostics, Inc. Tampa, Fla., FAaST Tools, http://www.sditampa.com, (2008).

30 N. A. Surplice and R. J. Darcy, J. Phys. E-Sci. Inst. 3, 477-482 (1970).

31 S. M. Sze, Physics of Semiconductor Devices (John Wiley & Sons, 1969).

32 E. H. Nicollian and J. R. Brews, MOS (Metal Oxide Semiconductor) Physics and Technology (John Wiley & Sons, 1982).

33 E. Arnold, IEEE Trans. Electron Devices 46, 497-503 (1999).

34 O. Kordina, J. P. Bergman, C. Hallin, and E. Janzen, Appl. Phys. Lett. 69, 679-681 (1996).

35 T. Kimoto, K. Danno, and J. Suda, Phys. Status Solidi B-Basic Solid State Phys. 245, 1327-1336 (2008).

36 T. Hiyoshi and T. Kimoto, Appl. Phys. Express 2, 0411011-0411013 (2009).

37 P. B. Klein, J. Appl. Phys. 103, 0337021-03370214 (2008).

38 C. J. Cochrane, P. M. Lenahan, and A. J. Lelis, J. Appl. Phys. 105, 0645021-0645027 (2009).

39 A. Savtchouk, E. Oborina, A. M. Hoff, and J. Lagowski, in Silicon Carbide and Related Materials 2003, Pts 1 and 2; Vol. 457-460 (2004), p. 755-758.

40 D. K. Schroder, Semiconductor Material and Device Characterization, 2 ed. (John Wiley & Sons, New York, 1998).

41 A. M. Hoff and D. K. DeBusk, in PV199916: Analytical and Diagnostic Techniques for Semiconductor Materials, Devices, and Processes, edited by B. Kolbesen, C. Claeys, P. Stallhofer, F. Tardif, J. Benton, T. Shaffner, D. Schroeder, S. Kishino, and P. Rai-Choudhury (Electrochemical Society, 1999).

42 A. J. Lelis, D. Habersat, R. Green, A. Ogunniyi, M. Gurfinkel, J. Suchle, and N. Goldsman, IEEE Trans. Electron Devices 55, 1835-1840 (2008).

What is claimed is:

1. A method of determining an interface trap density at an interface between a semiconductor and a dielectric or oxide layer disposed on a surface of the semiconductor, comprising:

placing an initial electric charge on at least a portion of a surface of a dielectric or oxide layer disposed on a semiconductor, wherein placing the initial electric charge on the surface of the dielectric or oxide layer creates an accumulation state in the semiconductor, wherein placing the initial charge on the surface of the dielectric or oxide layer results in an electric charge, $Q_C$, on the surface of the dielectric or oxide layer, placing at least two increments of additional electric charge on the at least a portion of the surface of the dielectric or oxide layer, wherein each of the at least two increments of additional electric charge have an opposite sign as the initial electric charge, wherein after placement of the at least two increments of additional electric charge on the at least a portion of the surface of the dielectric layer the semiconductor is in depletion, wherein the electric charge, $Q_C$, changes with the placement of each of the at least two increments of additional electric charge, measuring a corresponding value of a contact potential difference voltage, $V_{CPD}$, after placement of each of the at least two increments of additional electric charge on the at least a portion of the surface of the dielectric layer, wherein each measured value of the contact potential difference, $V_{CPD}$, corresponds to a value of electric charge, $Q_C$, on the surface of the dielectric layer, determining a dielectric capacitance, $C_{OX}$, value of the dielectric layer while the semiconductor is in accumulation from the measured contact potential difference voltage, $V_{CPD}$, values and corresponding electric charge, $Q_C$, values, and values of the at least two increments of additional electric charge, determining a flat band voltage, $V_{FB}$, of the contact potential difference voltage, $V_{CPD}$, from a doping level in the semiconductor and the dielectric capacitance value, $C_{OX}$, determining one or more surface barrier voltage values, $V_{SB}$, wherein the surface barrier voltage value, $V_{SB}$, is a difference between the contact potential difference voltage, $V_{CPD}$, on a $V_{CPD}$-$Q_C$ curve at the corresponding electric charge, $Q_C$, and a voltage value, $V_{OX}$, on a straight line at the corresponding electric charge, $Q_C$, wherein the line has a slope that is an inverse of the dielectric capacitance value, $C_{OX}$, and the line intersects the $V_{CPD}$-$Q_C$ curve based on the measured contact potential difference voltage values, $V_{CPD}$, and corresponding electric charge values, $Q_C$, at the flatband voltage, $V_{FB}$, and determining one or more interface trap densities, $D_{it}$, for a corresponding one or more electric charge values, $Q_C$, from the corresponding one or more electric charge values, $Q_C$, the corresponding surface barrier voltage values, $V_{SB}$, the doping level in the semiconductor, and an extrinsic Debye length, $L_D$, for the semiconductor.

2. The method according to claim 1,
wherein the semiconductor is an n-type semiconductor, wherein the initial electric charge is a positive electric charge, wherein the at least two increments of additional electric charge are negative electric charge.

3. The method according to claim 1,
wherein the semiconductor is a p-type semiconductor, wherein the initial electric charge is a negative electric charge, wherein the at least two increments of additional electric charge are positive electric charge.

4. The method according to claim 1, wherein determining the dielectric capacitance value, $C_{OX}$, comprises finding a slope of $V_{CPD}$ versus $Q_C$ while the semiconductor is in accumulation.

5. The method according to claim 4, wherein the semiconductor is in accumulation when a first ratio of a change in the measured contact potential difference voltage, $V_{CPD}$, from before placing a first of the at least two increments of additional electric charge and after placing the first of the at least two increments of additional electric charge to a value of the first of the at least two increments of additional electric charge is the same as a second ratio of a change in the measured contact potential difference voltage, $V_{CPD}$, from before placing a second of the at least two increments of additional electric charge and after placing the second of the at least two increments of additional electric charge to a value of the second of the at least two increments of additional electric charge.

6. The method according to claim 5, wherein the first ratio is the same as the second ratio when the second ratio is within 5% of the first ratio.

7. The method according to claim 1, further comprising measuring a value of the $V_{CPD}$ before placement of the at least two increments of additional electric charge.

8. The method according to claim 1, wherein determining the flat band voltage, $V_{FB}$, comprises determining a flat band capacitance, $C_{FB}$, from the relationship $$C_{FB} = \frac{C_{OX} C_S}{C_{OX} + C_S},$$

where $C_S$ is a semiconductor capacitance,
where $C_S$ is a function of the doping level in the semiconductor and the contact potential difference voltage, $V_{CPD}$, and
determining the flat band voltage, $V_{FB}$, that corresponds to the flat band capacitance, $C_{FB}$, from the measured contact potential difference voltage values, $V_{CPD}$, and corresponding electric charge values, $Q_C$.

9. The method according to claim 1, wherein determining one or more interface trap densities, $D_{it}$, comprises determining at least one interface trap density, $D_{it}$, corresponding to an electric charge, $Q_C$, having a corresponding contact potential difference voltage value, $V_{CPD}$, greater than the flat band voltage, $V_{FB}$.

10. The method according to claim 1, wherein determining one or more interface trap densities, $D_{it}$, comprises determining at least one interface trap density, $D_{it}$, corresponding to an electric charge, $Q_C$, having a corresponding contact potential difference voltage value, $V_{CPD}$, less than the flat band voltage, $V_{FB}$.

11. The method according to claim 4, wherein the slope of $V_{CPD}$ versus $Q_C$ while the semiconductor is in accumulation is the inverse of the dielectric capacitance value $C_{OX}$.

12. The method according to claim 1, wherein the semiconductor is n-type or p-type, wherein the semiconductor has a doping density in the range of $10^{11}/cm^3$ to $10^{18}/cm^3$.

13. The method according to claim 1, wherein measuring a corresponding value of a contact potential difference voltage, $V_{CPD}$, after placement of each of the at least two increments of additional electric charge on the at least a portion of the surface of the dielectric layer is performed in the dark.

14. The method according to claim 1, further comprising:
confirming, after placing the initial electric charge on the at least a portion of the surface of the dielectric layer disposed on the semiconductor, that the semiconductor is in an accumulation state, wherein confirming that the semiconductor is in an accumulation state comprises:
measuring the contact potential difference voltage, $V_{CPD}$, before and after placing a first of the at least two increments of additional electric charge;
determining a first ratio of a difference in the contact potential difference voltage, $V_{CPD}$, between before and after placing the first of the at least two increments of additional electric charge and a first value of the first of the at least two increments of additional electric charge;
measuring the contact potential difference voltage, $V_{CPD}$, before and after placing a second of the at least two increments of additional electric charge;
determining a second ratio of a difference in the contact potential difference voltage, $V_{CPD}$, between before and after placing the second of the at least two increments of additional electric charge and a second value of the second of the at least two increments of additional electric charge; and
confirming the second ratio is the same as the first ratio, wherein when the second ratio is the same as the first ratio the semiconductor is in an accumulation state.

15. The method according to claim 14, wherein the second ratio is the same as the first ratio when the second ratio is within 5% of the first ratio.

16. The method according to claim 1, wherein each of the at least two increments of additional electric charge are the same.

17. The method according to claim 1, wherein placing at least two increments of additional electric charge on the at least a portion of the surface of the dielectric or oxide layer comprises placing one or more of the at least two increments of additional electric charge on the at least a portion of the surface of the dielectric or oxide layer until the semiconductor is not in an accumulation state and placing further of the at least two increments of additional electric charge on the at least a portion of the surface of the dielectric or oxide layer until the semiconductor is in depletion.

18. A method of determining an interface trap charge at an interface between a semiconductor and a dielectric or oxide layer disposed on a surface of the semiconductor, comprising:

placing an initial electric charge on at least a portion of a surface of a dielectric or oxide layer disposed on a semiconductor, wherein placing the initial electric charge on the surface of the dielectric or oxide layer creates an accumulation state in the semiconductor, wherein placing the initial charge on the surface of the dielectric or oxide layer results in an electric charge, $Q_C$, on the surface of the dielectric or oxide layer, placing at least two increments of additional electric charge on the portion of the surface of the dielectric or oxide layer, wherein each of the at least two increments of additional electric charge have an opposite sign as the initial electric charge, wherein after placement of the at least two increments of additional electric charge on the at least a portion of the surface of the dielectric or oxide layer the semiconductor is in depletion, wherein the electric charge, $Q_C$, changes with the placement of each of the at least two increments of additional electric charge, measuring a corresponding value of a contact potential difference voltage, $V_{CPD}$, after placement of each of the at least two increments of additional electric charge on the at least a portion of the surface of the dielectric or oxide layer, wherein each measured value of the contact potential difference, $V_{CPD}$, corresponds to a value of electric charge, $Q_C$, on the surface of the dielectric or oxide layer, determining a dielectric capacitance, $C_{OX}$, value of the dielectric or oxide layer while the semiconductor is in accumulation from the measured contact potential difference voltage, $V_{CPD}$, values and corresponding electric charge, $Q_C$, values, and values of the at least two increments of additional electric charge, determining a flat band voltage, $V_{FB}$, of the contact potential difference voltage ($V_{CPD}$) from a doping level in the semiconductor and the dielectric capacitance value, $C_{OX}$, wherein the line has a slope that is an inverse of the dielectric capacitance value, $C_{OX}$, and the line intersects the $V_{CPD}$-$Q_C$ curve based on the measured contact potential difference voltage values, $V_{CPD}$, and corresponding electric charge values, $Q_C$, at the flatband voltage, $V_{FB}$, determining one or more surface barrier voltage values, $V_{SB}$, wherein the surface barrier voltage value, $V_{SB}$, is a difference between the contact potential difference voltage, $V_{CPD}$, on a $V_{CPD}$-$Q_C$ curve at the corresponding electric charge, $Q_C$, and a voltage value, $V_{OX}$, on a line at the corresponding electric charge, $Q_C$, wherein the line has a slope that is an inverse of the dielectric capacitance value, $C_{OX}$, and the line intersects the $V_{CPD}$-$Q_C$ curve based on the measured contact potential difference voltage values, $V_{CPD}$, and corresponding electric charge values, $Q_C$, at the flatband voltage, $V_{FB}$, and determining one or more interface trap charge values, $Q_{it}$, for a corresponding one or more electric charge values, $Q_C$, from the corresponding one or more electric charge values, $Q_C$, the corresponding surface barrier voltage values, $V_{SB}$, the doping level in the semiconductor, and an extrinsic Debye length, $L_D$, for the semiconductor.

19. The method according to claim 18, wherein measuring a corresponding value of a contact potential difference voltage, $V_{CPD}$, after placement of each of the at least two increments of additional electric charge on the at least a portion of the surface of the dielectric layer is performed in the dark.

* * * * *

UNITED STATES PATENT AND TRADEMARK OFFICE
CERTIFICATE OF CORRECTION

PATENT NO. : 8,803,533 B2
APPLICATION NO. : 13/345050
DATED : August 12, 2014
INVENTOR(S) : Elena I. Oborina and Andrew Hoff It is certified that error appears in the above-identified patent and that said Letters Patent is hereby corrected as shown below:

In the Specification

Column 5,
Line 9, "deter mined from" should read --determined from--.
Line 26, "(lop Publishing" should read --(Iop Publishing--.
Line 45, "$V_{CPD}=\Phi_{ms}^0+$ ..." should read --$V_{CPD} = \Phi_{ms}^0 + $ ...--.
Line 46, "$\Phi_{ms}^0$ ..." should read --$\Phi_{ms}^0$ ...--.
Line 62, "$V_{SB}=V_{CPD}^{Dark}-V_{CPD}^{Light}$ ..." should read --$V_{SB} = V_{CPD}^{Dark} - V_{CPD}^{Light}$ ...--.

Column 6,
Line 24, "$|\Delta Q_{it}|=$ ..." should read --$|\Delta Q_{it}| = $ ...--.
Line 33, "$V_{CPD}^{Dark}$ and $V_{CPD}^{Light}$" should read --$V_{CPD}^{Dark}$ and $V_{CPD}^{Light}$--.

Column 8,
Line 21, "According to $^{40}$ the" should read --According to D. K. Schroder, *Semiconductor Material and Device* Characterization, 2 ed. (John Wiley & Sons), New York 1998) the--.
Line 29, "Hatband condition" should read --flatband condition--.
Line 37, "$\in_S$ and $\in_0$" should read --$\varepsilon_S$ and $\varepsilon_0$--.
Line 52, "Hatband voltage" should read --flatband voltage--.

Column 9,
Line 66, "CV1 and CV2" should read --CV1 and CV2--.

Signed and Sealed this
Twenty-eighth Day of July, 2015

Michelle K. Lee
*Director of the United States Patent and Trademark Office*

CERTIFICATE OF CORRECTION (continued)
U.S. Pat. No. 8,803,533 B2

Column 10,
Lines 1-2, "CV1, and under illumination, CV2" should read --CV1, and under illumination, CV2--.
Line 3, "CV1 and CV2" should read --CV1 and CV2--.
Line 6, "CV3" should read --CV3--.
Line 11, "CV3" should read --CV3--.
Line 14, "CV1" should read --CV1--.
Line 46, "CV1 and CV3" should read --CV1 and CV3--.
Line 58, "J. Suchle," should read --J. Suehle,--.

Column 16,
Line 27, "J. Suchle," should read --J. Suehle,--.

In the Claims

Column 16,
Line 38, Claim 1, "the initial charge" should read --the initial electric charge--.
Line 47, Claim 1, "the dielectric layer" should read --the dielectric or oxide layer--.
Line 54, Claim 1, "the dielectric layer" should read --the dielectric or oxide layer--.
Line 57, Claim 1, "the dielectric layer" should read --the dielectric or oxide layer--.
Lines 58-59, Claim 1, "the dielectric layer" should read --the dielectric or oxide layer--.

Column 17,
Lines 5-6, Claim 1, "a straight line" should read --a line--.

Column 18,
Line 25, Claim 13, "the dielectric layer" should read --the dielectric or oxide layer--.
Line 28, Claim 14, "the dielectric layer" should read --the dielectric or oxide layer--.

Column 19,
Line 9, Claim 18, "the initial charge" should read --the initial electric charge--.

Column 20,
Lines 7-11, Claim 18, delete "wherein the line has a slope that is an inverse of the dielectric capacitance value, $C_{OX}$, and the line intersects the $V_{CPD}$-$Q_C$ curve based on the measured contact potential difference voltage values, $V_{CPD}$, and corresponding electric charge values, $Q_C$, at the flatband voltage, $V_{FB}$,".
Line 33, Claim 19, "the dielectric layer" should read --the dielectric or oxide layer--.